(12) United States Patent
Chen et al.

(10) Patent No.: US 9,781,821 B2
(45) Date of Patent: Oct. 3, 2017

(54) THERMOELECTRIC COOLING MODULE

(71) Applicant: DELTA ELECTRONICS, INC., Taoyuan (TW)

(72) Inventors: Lee-Lung Chen, Taoyuan (TW); Ching-Shun Wang, Taoyuan (TW); Jin-Hong Cai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 55 days.

(21) Appl. No.: 15/074,558

(22) Filed: Mar. 18, 2016

(65) Prior Publication Data
US 2017/0223817 A1 Aug. 3, 2017

(30) Foreign Application Priority Data

Jan. 29, 2016 (TW) .............................. 105102796 A

(51) Int. Cl.
*H05K 7/20* (2006.01)
*H05K 1/02* (2006.01)
*H05K 1/14* (2006.01)
*H05K 1/11* (2006.01)

(52) U.S. Cl.
CPC ........... *H05K 1/0203* (2013.01); *H05K 1/115* (2013.01); *H05K 1/144* (2013.01); *H05K 7/20854* (2013.01)

(58) Field of Classification Search
None
See application file for complete search history.

(56) References Cited

U.S. PATENT DOCUMENTS

| 6,540,525 | B1* | 4/2003 | Li | H01R 12/523 439/331 |
| 7,633,154 | B2* | 12/2009 | Dai | H01L 25/167 257/712 |
| 8,664,509 | B2* | 3/2014 | Liu | H01L 35/30 136/201 |
| 8,901,735 | B2* | 12/2014 | Yu | H01L 23/147 257/686 |
| 9,322,580 | B2* | 4/2016 | Hershberger | H05K 1/0203 |
| 9,496,476 | B2* | 11/2016 | Maeshima | H01L 35/16 |
| 9,559,282 | B2* | 1/2017 | Yajima | H01L 35/32 |
| 2007/0028955 | A1* | 2/2007 | Sogou | H01L 35/10 136/200 |

(Continued)

*Primary Examiner* — Courtney Smith
(74) *Attorney, Agent, or Firm* — Hauptman Ham, LLP

(57) ABSTRACT

A thermoelectric cooling module includes a first circuit board, a second circuit board, first conducting members, second conducting members and TED chips. The first circuit board includes first circuit regions, each having a first conducting layer and first penetrating holes; the second circuit board includes second circuit regions, each having a second conducting layer and second penetrating holes; each first conducting member is passed and fixed into each respective first penetrating hole; each second conducting member is passed and fixed into each respective second penetrating hole; each TED chip is clamped between the first circuit board and the second circuit board, and each first conducting member has an end attached to the TED chip and the other end attached to the first conducting layer, and each second conducting member has an end attached to the TED chip and the other end attached to the second conducting layer.

14 Claims, 4 Drawing Sheets

(56) References Cited

U.S. PATENT DOCUMENTS

| | | | | |
|---|---|---|---|---|
| 2007/0261730 A1* | 11/2007 | Seker | ..................... | H01L 35/30 |
| | | | | 136/224 |
| 2009/0072385 A1* | 3/2009 | Alley | ..................... | H01L 23/38 |
| | | | | 257/713 |
| 2011/0247670 A1* | 10/2011 | Ohmura | ................. | H01L 35/32 |
| | | | | 136/212 |
| 2012/0057305 A1* | 3/2012 | Morisaku | ................ | H01L 35/30 |
| | | | | 361/720 |
| 2016/0315242 A1* | 10/2016 | Okuzono | ............... | H01L 35/32 |

* cited by examiner

THERMOELECTRIC COOLING MODULE

FIELD OF THE INVENTION

The technical field relates to a cooling module, and more particularly to a thermoelectric cooling module.

BACKGROUND OF THE INVENTION

Thermoelectric cooling (TEC) module is a solid-state device that controls a heat flow by current to provide a high-temperature or low-temperature environment and a general thermoelectric cooling module is capable of increasing or decreasing temperature quickly and maintaining a temperature steadily, and thus the thermoelectric cooling module becomes a cooling module with excellent heat dissipation efficiency.

The traditional thermoelectric cooling module comprises an upper ceramic substrate, a lower ceramic substrate, and a plurality of Thermo Electric Device (TED) chips, wherein a copper plate is installed at adjacent end surfaces of the upper ceramic substrate and the lower ceramic substrate, and copper plate, each TED chip is connected in series with the copper plates of the upper ceramic substrate and the lower ceramic substrate, and a solder paste is bonded between the copper plates and the TED chips, and a fin is connected separately to end surfaces of the upper ceramic substrate and the lower ceramic substrate which are disposed away from each other.

However, the traditional thermoelectric cooling module has the following drawbacks: 1. The complicated sintering and mold manufacturing processes of the ceramic substrate consume much energy, and it is difficult to cover and fix the copper plate to the surface of the ceramic plate, and thus the copper plate may be separated from the ceramic plate easily. 2. The TED chip must conduct heat to the copper plate before the heat is conducted to the fins through the copper plate and the ceramic substrate, and thus the thermal resistance is large, and a quick thermal conduction cannot be achieved. 3. The flexibility of configuring the ceramic substrate and the copper plate is poor, and thus the serial connection, parallel connection, shape, and size cannot be adjusted flexibly, and the ceramic substrate is lack of tenacity, so that the ceramic substrate may be cracked, broken, or damaged by vibration and thermal shock easily.

In view of the aforementioned problems of the prior art, the discloser of this disclosure based on years of experience in the related industry to conduct extensive researches and experiments, and finally provided a feasible solution to overcome the problems of the prior art.

SUMMARY OF THE INVENTION

It is a primary objective of this disclosure to provide a thermoelectric cooling module using a circuit board to substitute the conventional ceramic plate, wherein the circuit board with circuits comes with good elasticity and tenacity, and the heat generated by a TED chip can be conducted to the outside directly through a first conducting member and a second conducting member, so that the thermoelectric cooling module has the features of excellent conductivity, structural strength and heat dissipation efficiency.

To achieve the aforementioned and other objectives, this disclosure provides a thermoelectric cooling module, comprising: a first circuit board, including a plurality of first circuit regions, each having a plurality of first penetrating holes, and each first penetrating hole penetrating through the first circuit board; a second circuit board, stacked on the first circuit board, and having a plurality of second circuit regions, each having a plurality of second penetrating holes, and each second penetrating hole penetrating through the second circuit board; a plurality of first conducting members, passed and fixed to the first penetrating holes respectively; a plurality of second conducting members, passed and fixed to the second penetrating holes respectively; and a plurality of TED chips, clamped between the first circuit board and the second circuit board, and configured to be corresponsive to the first circuit regions and the second circuit regions respectively, and the plurality of first conducting members having an end attached to the TED chip and the plurality of second conducting members having an end attached to the TED chip.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
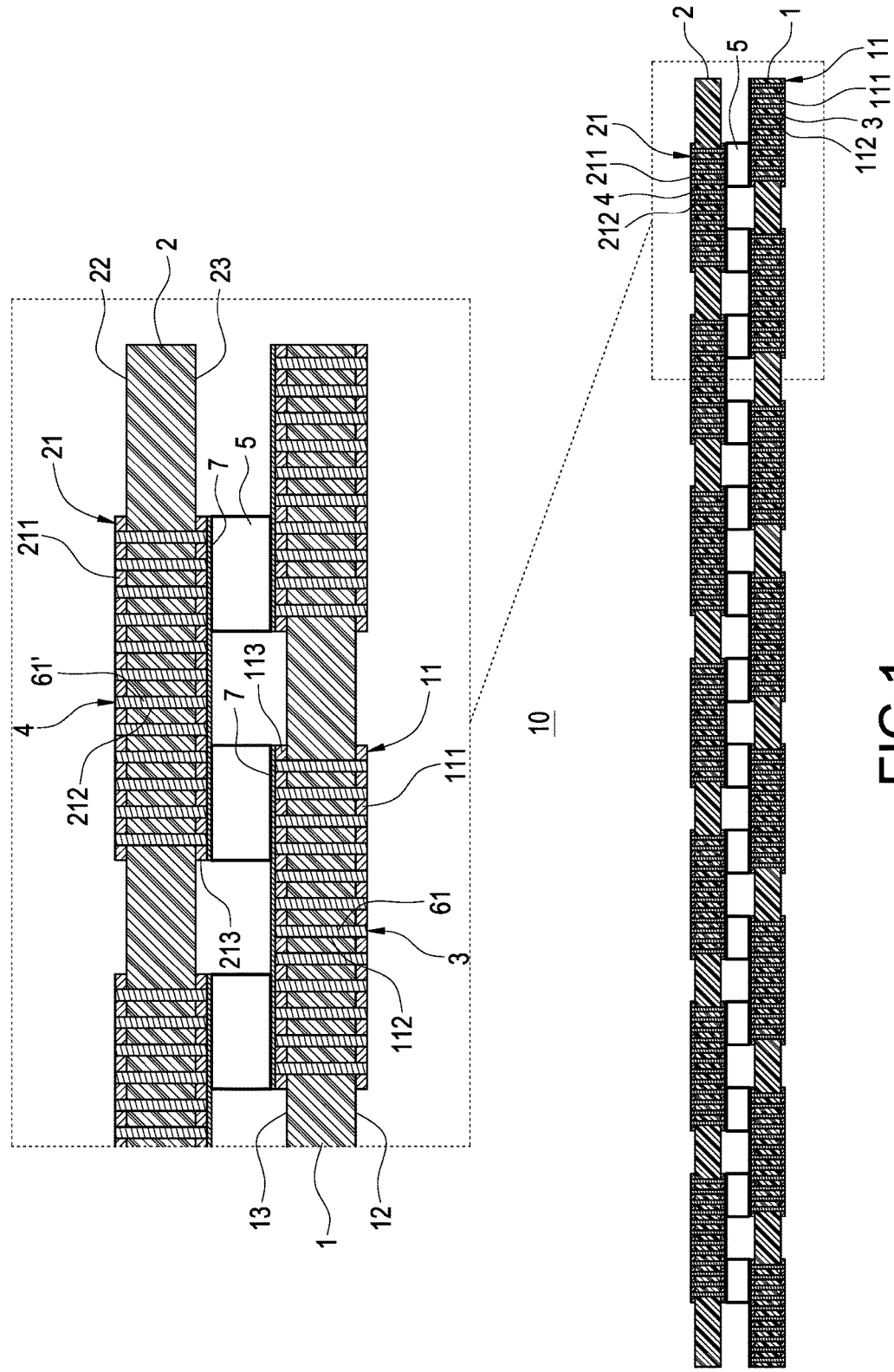
FIG. 1 is a cross-sectional view of a thermoelectric cooling module in accordance with an embodiment of this disclosure.

With reference to FIG. 1 for a thermoelectric cooling module of this disclosure, the thermoelectric cooling module 10 comprises a first circuit board 1, a second circuit board 2, a plurality of first conducting members 3, a plurality of second conducting members 4, and a plurality of TED chips 5.

The first circuit board 1 has a plurality of first circuit regions 11, and a plurality of first circuit regions 11 which are arranged apart with each other and in a front rear, left, and right matrix form, and each first circuit region 11 has a first conducting layer 111, a first circuit layer 113 and a plurality of first penetrating holes 112, and the first conducting layer 111 is covered onto an outer surface 12 of the first circuit board 1, and the first circuit layer 113 is covered onto an inner surface 13 of the first circuit board 1, and each first penetrating hole 112 penetrates through the first circuit board 1, the first conducting layer 111, and the first circuit layer 113.

The second circuit board 2 is stacked on the first circuit board 1, and the second circuit board 2 has a plurality of second circuit regions 21 arranged apart with each other and in a front, rear, left, and right matrix form, and each second circuit region 21 has a second conducting layer 211, a second circuit layer 213 and a plurality of second penetrating holes 212, and the second conducting layer 211 is covered onto an outer surface 22 of the second circuit board 2, and the second circuit layer 213 is covered onto an inner surface 23 of the second circuit board 2, and each second penetrating hole 212 penetrates through the second circuit board 2, the second conducting layer 211 and the second circuit layer 213.

In addition, each first conducting layer 111, each second conducting layer 211, each first circuit layer 113 or each second circuit layer 213 is a copper foil or a gold foil.

Each first conducting member 3 is passed and fixed to each respective first penetrating hole 112, so that each first circuit layer 113 and each first conducting layer 111 are attached and electrically coupled to the plurality of first conducting members 3 respectively. Wherein, each first conducting member 3 is a metal column 61 made of copper, silver, gold, tin, or any other metal of high thermal conductivity.

Each second conducting member 4 is passed and fixed to each respective second penetrating hole 212, so that each second circuit layer 213 and each second conducting layer 211 are attached and electrically coupled to the plurality of second conducting members 4 respectively. Wherein, each second conducting member 4 is a metal column 61' made of copper, silver, gold, tin, or any other metal of high thermal conductivity.

The TED chips 5 are clamped between the first circuit board 1 and the second circuit board 2 and arranged apart from one another and in a front, rear, left and right matrix form, and each TED chip 5 is configured to be corresponsive to each respective first circuit region 11 and each respective second circuit region 21, and an end of the plurality of first conducting members 3 is attached to the TED chip 5, the other end of the plurality of first conducting members 3 is attached to the first conducting layer 111, and an end of the plurality of second conducting members 4 is attached to the TED chip 5, and the other end of the plurality of second conducting members 4 is attached to the second conducting layer 211.

In addition, the plurality of first circuit regions 11 and the plurality of second circuit regions 21 are staggered in positions with respective to each other. In other words, each first circuit region 11 is arranged between two second circuit regions 21, and each second circuit region 21 is arranged between two first circuit regions 11, and each first circuit layer 113, each second circuit layer 213 and each TED chip 5 are electrically connected in series as follows.

Each of the two adjacent TED chips 5 has a surface attached to the first circuit layer 113 of the same first circuit region 11 and electrically connected in series with the first circuit layer 113 and another surface attached to the second circuit layers 213 of different second circuit regions 21 respectively; and each of the two adjacent TED chips 5 has a surface attached to the second circuit layer 213 of the same second circuit region 21 and electrically connected in series with the second circuit layer 213, and another surface attached to the first circuit layers 113 of different first circuit regions 11 respectively, so as to achieve the effect of electrically connecting the plurality of TED chips 5 in series.

The thermoelectric cooling module 10 of this disclosure further comprises a plurality of conductive agents 7, and a part of the conductive agents 7 are clamped between the plurality of TED chips 5 and each first circuit layer 113 and the other part of the conductive agents 7 are clamped between the plurality of TED chips 5 and each second circuit layer 213, wherein each conductive agent 7 is a solder paste or a silver paste for improving the conductivity between the TED chip 5 and the first circuit layer 113 or the second circuit layer 213.

The assembly of the thermoelectric cooling module 10 of this disclosure adopts a first circuit board 1 having a plurality of first circuit regions 11, and each having a plurality of first penetrating holes 112, and each first penetrating hole 112 penetrating through the first circuit board 1; a second circuit board 2 stacked on the first circuit board 1 and having a plurality of second circuit regions 21, each having a plurality of second penetrating holes 212, and each second penetrating hole 212 penetrating through the second circuit board 2; each first conducting member 3 being passed and fixed to each respective first penetrating hole 112; each second conducting member 4 being passed and fixed to each respective second penetrating hole 212; a plurality of TED chips 5 clamped between the first circuit board 1 and the second circuit board 2, and each TED chip 5 being configured to be corresponsive to each respective first circuit region 11 and each respective second circuit region 21, and the plurality of first conducting members 3 having an end attached to the TED chip 5, and the plurality of second conducting members 4 having an end attached to the TED chip 5.

In an application of the thermoelectric cooling module 10 of this disclosure, the first circuit board 1 and the second circuit board 2 are used to substitute the conventional ceramic plate. With the excellent elasticity and tenacity of the circuit board and the use of a copper foil or gold foil for making the circuit layer and the conducting layer, the heat or coldness generated by the TED chips 5 may be conducted to the outside directly through the first conducting member 3 and the first conducting layer 111 and the second conducting member 4 and the second conducting layer 211, so that the thermoelectric cooling module 10 have the features of excellent conductivity, structural strength and heat dissipation efficiency.

In addition, the first circuit board 1 and the second circuit board 2 have the circuit layer and the conducting layer made of a copper foil or a gold foil, so that the first circuit layer 113 and the first conducting layer 111 will not be separated or shifted away from the first circuit board 1, and the second circuit layer 213 and the second conducting layer 211 will not be separated or shifted away from the second circuit board 2, so that the TED chips 5 are securely and electrically coupled to the first circuit layer 113 and the second circuit layer 213, so as to improve the stability of the electrical conduction of the thermoelectric cooling module 10.

Since the first circuit board 1 and the second circuit board 2 have better elasticity and tenacity than the ceramic plate, therefore the serial connection, parallel connection, shape, and size of the first circuit board 1 and the second circuit board 2 may be adjusted flexibly, and the first circuit board 1 and the second circuit board 2 will not be cracked, broken or damaged easily by vibration or thermal shock, so as to enhance the of the structural strength of the thermoelectric cooling module 10.

Figure 2:
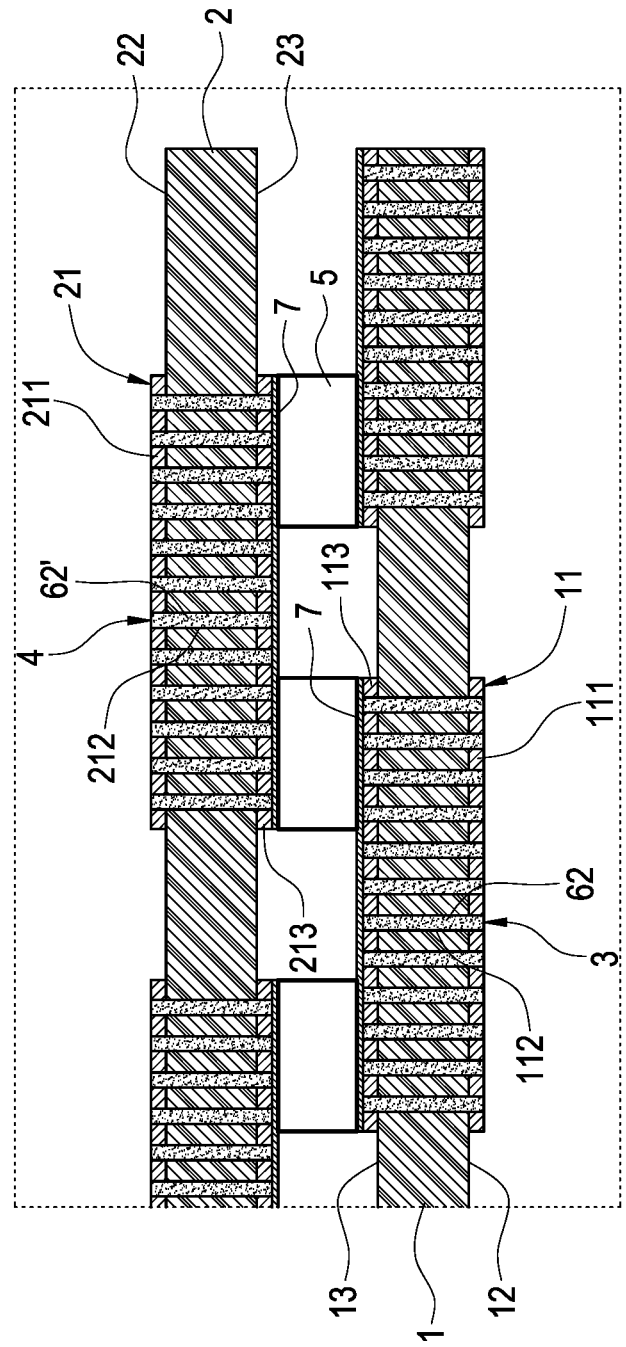
FIG. 2 is a cross-sectional view of another thermoelectric cooling module in accordance with an embodiment of this disclosure.

With reference to FIG. 2 for a thermoelectric cooling module 10 in accordance with another embodiment of this disclosure, this embodiment is substantially the same as the embodiment of FIG. 1, except that each first conducting member 3 and each second conducting member 4 of this embodiment are solders 62, 62'.

Specifically, each first conducting member 3 is a solder 62 filled into the first penetrating hole 112, and each second conducting member 4 is a solder 62' filled into the second penetrating hole 212. Like the metal column, the solders 62, 62' with good thermal conductivity can achieve the functions and effects of the preferred embodiment of FIG. 1.

Figure 3:
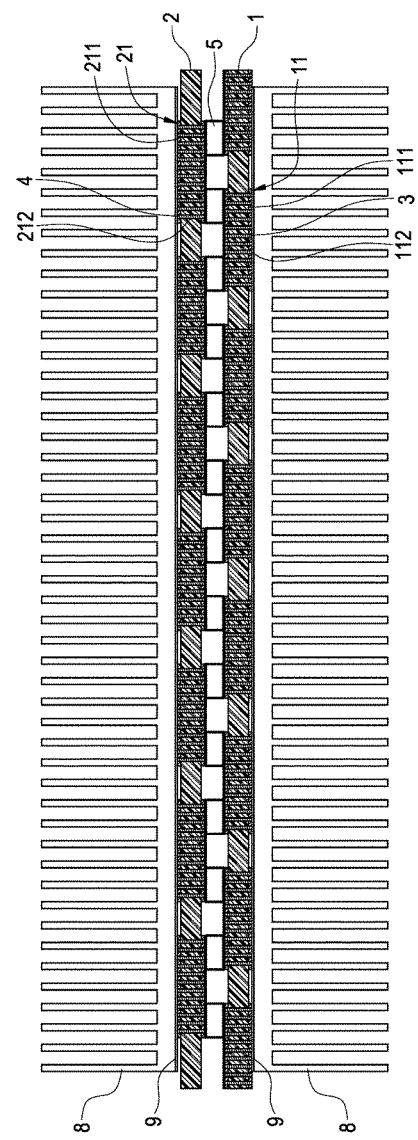
FIG. 3 is a cross-sectional view of a thermoelectric cooling module in accordance with a further embodiment of this disclosure.
Figure 4:
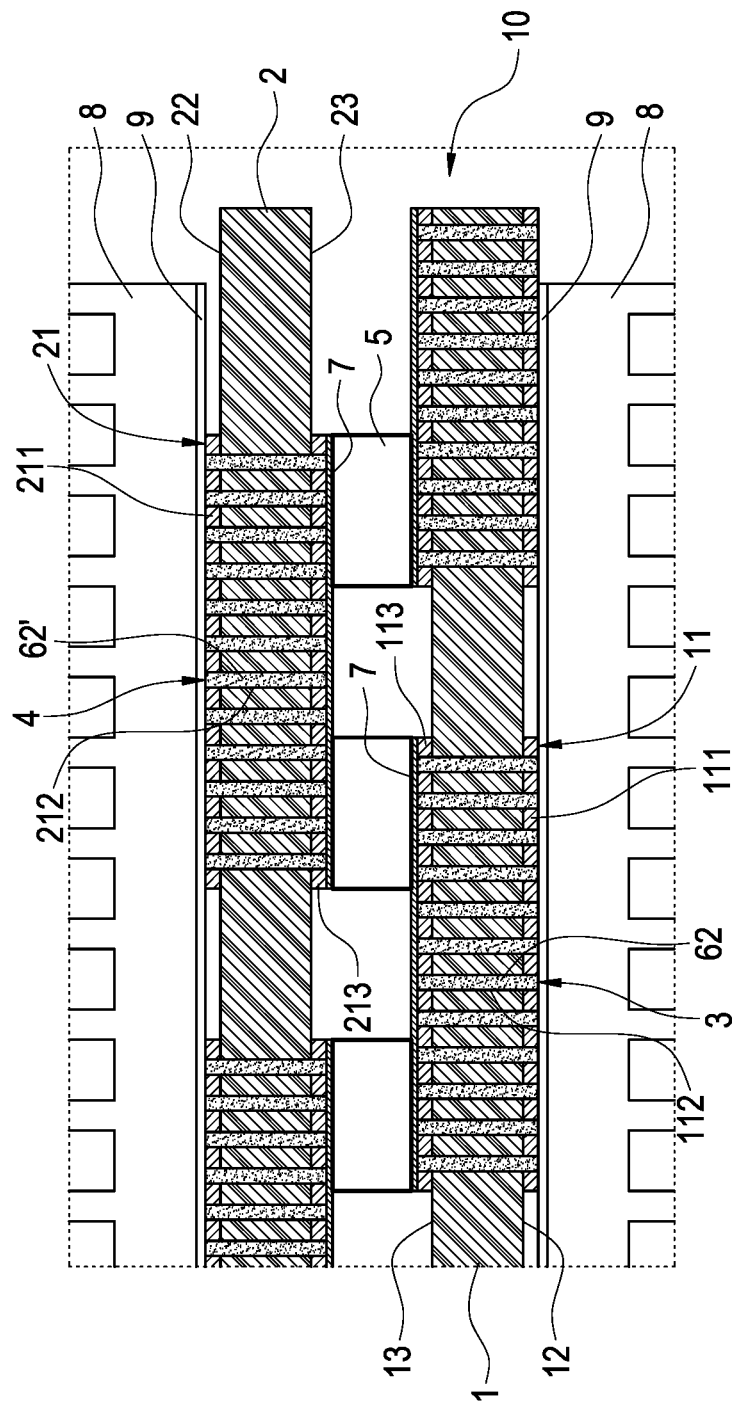
FIG. 4 is a partial blowup view of FIG. 3 of this disclosure.

With reference to FIGS. 3 and 4 for a thermoelectric cooling module 10 in accordance with a further embodiment of this disclosure, this embodiment is substantially the same as the embodiment of FIG. 1, except that the thermoelectric cooling module 10 of this embodiment further comprises two heat dissipating fin modules 8 and two insulating layers 9.

Further, one of the heat dissipating fin modules 8 is attached to the plurality of first conducting layers 111, and the other heat dissipating fin module 8 is attached to the plurality of second conducting layers 211, and one of the insulating layers 9 is included between the plurality of first conducting layers 111 and one of the heat dissipating fin modules 8 and the other insulating layer 9 is included between the plurality of second conducting layers 211 and the other heat dissipating fin module 8, so that the heat or coldness generated by the TED chips 5 can be conducted through the first conducting member 3 and the first conducting layer 111, and the second conducting member 4 and the second conducting layer 211 to the corresponsive heat dissipating fin module 8, and finally conducted to the outside quickly through the heat dissipating fin module 8, so as to improve the heat dissipation efficiency of the thermoelectric cooling module 10.

In addition, one of the insulating layers 9 is included between the plurality of first conducting layers 111 and one of the heat dissipating fin modules 8, and the other insulating layer 9 is included between the plurality of second conducting layers 211 and the other heat dissipating fin module 8 to prevent the first circuit board 1 and the second circuit board 2 from being conducted to the outside and to prevent a failure of the TED chip 5, so as to enhance the stability of the electrical conduction of the thermoelectric cooling module 10.

While this disclosure has been described by means of specific embodiments, numerous modifications and variations could be made thereto by those skilled in the art without departing from the scope and spirit of this disclosure set forth in the claims.

What is claimed is:

1. A thermoelectric cooling module, comprising:
a first circuit board, having a plurality of first circuit regions, and each first circuit region having a plurality of first penetrating holes, and each first penetrating hole penetrating through the first circuit board;
a second circuit board, stacked on the first circuit board, and the second circuit board having a plurality of second circuit regions, and each second circuit region having a plurality of second penetrating holes, and each second penetrating hole penetrating through the second circuit board;
a plurality of first conducting members, passed and fixed to the first penetrating holes respectively;
a plurality of second conducting members, passed and fixed to the second penetrating holes respectively; and
a plurality of TED chips, clamped between the first circuit board and the second circuit board, configured to be corresponsive to the first circuit regions and the second circuit regions respectively, and the plurality of first conducting members having an end attached to the TED chip and the plurality of second conducting members having an end attached to the TED chip.

2. The thermoelectric cooling module according to claim 1, wherein each first circuit region has a first conducting layer covered onto an outer surface of the first circuit board, and each first penetrating hole is penetrated through the first conducting layer; each second circuit region has a second conducting layer covered onto an outer surface of the second circuit board, and each second penetrating hole is penetrated through the second conducting layer; the other end of the plurality of first conducting members is attached to the first conducting layer, and the other end of the plurality of second conducting members is attached to the second conducting layer.

3. The thermoelectric cooling module according to claim 1, wherein each first conducting member and each second conducting member are metal columns respectively, and each metal column is made of copper, silver, gold, or tin.

4. The thermoelectric cooling module according to claim 1, wherein each first conducting member is a solder filled into the first penetrating hole, and each second conducting member is a solder filled into the second penetrating hole.

5. The thermoelectric cooling module according to claim 2, wherein each first conducting layer and each second conducting layer are copper foils or gold foils respectively.

6. The thermoelectric cooling module according to claim 1, wherein the plurality of first circuit regions and the plurality of second circuit regions are arranged in a staggered manner, and each first circuit region has a first circuit layer covered onto an inner surface of the first circuit board, and each second circuit region has a second circuit layer covered onto an inner surface of the second circuit board.

7. The thermoelectric cooling module according to claim 6, wherein each of the two adjacent TED chips has a surface attached to the first circuit layer of the same first circuit region and electrically connected to the first circuit layer in series and another surface attached to the second circuit layers of different second circuit regions respectively.

8. The thermoelectric cooling module according to claim 6, wherein each of the two adjacent TED chips has a surface attached to the second circuit layer of the same second circuit region and electrically connected to the second circuit layer in series and another surface attached to the first circuit layers of different circuit regions respectively.

9. The thermoelectric cooling module according to claim 6, wherein each first penetrating hole is penetrated through the first circuit layer, and each first circuit layer is attached and electrically coupled to the plurality of first conducting members, and each second penetrating hole is penetrated through the second circuit layer, and each second circuit layer is attached and electrically coupled to the plurality of second conducting members.

10. The thermoelectric cooling module according to claim 6, further comprising a plurality of conductive agents, and a portion of the conductive agents is clamped between the plurality of TED chips and each first circuit layer, and another portion of the conductive agents is clamped between the plurality of TED chips and each second circuit layer, and each conductive agent being a solder paste or silver paste.

11. The thermoelectric cooling module according to claim 6, wherein each first circuit layer and each second circuit layer are copper foils or gold foils respectively.

12. The thermoelectric cooling module according to claim 2, further comprising two heat dissipating fin modules, and one of the heat dissipating fin modules being attached to the plurality of first conducting layers and another heat dissipating fin module being attached to the plurality of second conducting layers.

13. The thermoelectric cooling module according to claim 12, further comprising two insulating layers, and one of the insulating layers being included between the plurality of first conducting layers and one of the heat dissipating fin modules, and another insulating layer being included between the plurality of second conducting layers and another heat dissipating fin module.

14. The thermoelectric cooling module according to claim 1, wherein the plurality of first circuit regions are separated from one another and arranged into a matrix form, and the plurality of second circuit regions are separated from one another and arranged into a matrix form, and the plurality of TED chips are separated from one another and arranged into a matrix form.

* * * * *